(12) United States Patent
Latchford et al.

(10) Patent No.: US 10,400,323 B2
(45) Date of Patent: Sep. 3, 2019

(54) ULTRA-LOW DEFECT PART PROCESS

(71) Applicant: LAM RESEARCH CORPORATION, Fremont, CA (US)

(72) Inventors: Ian Scot Latchford, Palo Alto, CA (US); Mary Anne Plano, Mountain View, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 15/782,410

(22) Filed: Oct. 12, 2017

(65) Prior Publication Data

US 2018/0127864 A1 May 10, 2018

Related U.S. Application Data

(60) Provisional application No. 62/420,709, filed on Nov. 11, 2016, provisional application No. 62/417,529, filed on Nov. 4, 2016.

(51) Int. Cl.

| | |
|---|---|
| *C23C 16/02* | (2006.01) |
| *C23C 14/22* | (2006.01) |
| *C23C 14/02* | (2006.01) |
| *C23C 14/06* | (2006.01) |
| *C23C 16/22* | (2006.01) |
| *C23C 16/44* | (2006.01) |
| *C23C 16/455* | (2006.01) |
| *C23C 14/56* | (2006.01) |
| *C23C 16/46* | (2006.01) |

(52) U.S. Cl.
CPC .............. *C23C 14/22* (2013.01); *C23C 14/02* (2013.01); *C23C 14/06* (2013.01); *C23C 16/0209* (2013.01); *C23C 16/22* (2013.01); *C23C 16/4404* (2013.01); *C23C 16/45565* (2013.01); *C23C 14/56* (2013.01); *C23C 16/46* (2013.01)

(58) Field of Classification Search
CPC ........................... C23C 16/02; C23C 16/0209; C23C 16/0227; C23C 16/0272
See application file for complete search history.

(56) References Cited

U.S. PATENT DOCUMENTS

| | | | | | |
|---|---|---|---|---|---|
| 4,410,395 | A | * | 10/1983 | Weaver | ............. H01L 21/02008 |
| | | | | | 252/79.3 |
| 5,902,135 | A | * | 5/1999 | Schulze | .................. C30B 29/06 |
| | | | | | 257/E21.318 |

(Continued)

OTHER PUBLICATIONS

Ehrentraut, G., "Bevel edge treatment for reduction of defect density by plasma etch processes applied in silicon trench technologies". ECS Transactions, 35 (20) 7-15 (2011).*

(Continued)

*Primary Examiner* — Bret P Chen

(57) ABSTRACT

A method for removing and preventing defects on surfaces of a component of a substrate processing chamber includes loading the component into a vacuum chamber and, with the component loaded within the vacuum chamber, baking the component at a baking temperature during a first predetermined period to remove water and defects from the surfaces of the component, and purging the component within the vacuum chamber during at least one second predetermined period to remove the defects from the vacuum chamber.

15 Claims, 7 Drawing Sheets

(56) References Cited

U.S. PATENT DOCUMENTS

| | | | | |
|---|---|---|---|---|
| 6,534,380 B1* | 3/2003 | Yamauchi | ......... | H01L 21/76254 |
| | | | | 257/E21.568 |
| 2003/0031793 A1* | 2/2003 | Chang | ..................... | C23C 16/40 |
| | | | | 427/255.28 |
| 2010/0186512 A1* | 7/2010 | Goto | .................... | G01N 29/075 |
| | | | | 73/632 |
| 2010/0243192 A1* | 9/2010 | Balasubramanian | ... | B22C 9/061 |
| | | | | 164/4.1 |
| 2014/0127852 A1* | 5/2014 | de Souza | .......... | H01L 31/03682 |
| | | | | 438/97 |
| 2014/0158674 A1* | 6/2014 | Moffatt | .............. | B23K 26/0853 |
| | | | | 219/385 |
| 2014/0319544 A1* | 10/2014 | Hwang | ............. | H01L 21/02378 |
| | | | | 257/77 |
| 2016/0016286 A1* | 1/2016 | Suh | ........................ | B24C 1/003 |
| | | | | 451/40 |

OTHER PUBLICATIONS

Ahn, Heui-Gyun, et al., "Identification and removal of defects on silicon wafer processed with a rinse with/without megasonics in DI water". ICVC '99. 6th International Conference on VLSI and CAD (Cat. No. 99EX361). Oct. 26-27, 199, pp. 459-462.*

Uemura, Kenichi, et al., "Cleaning Technology of Silicon Wafers". Nippon Steel Technical Report No. 83, Jan. 2001, pp. 61-68.*

* cited by examiner

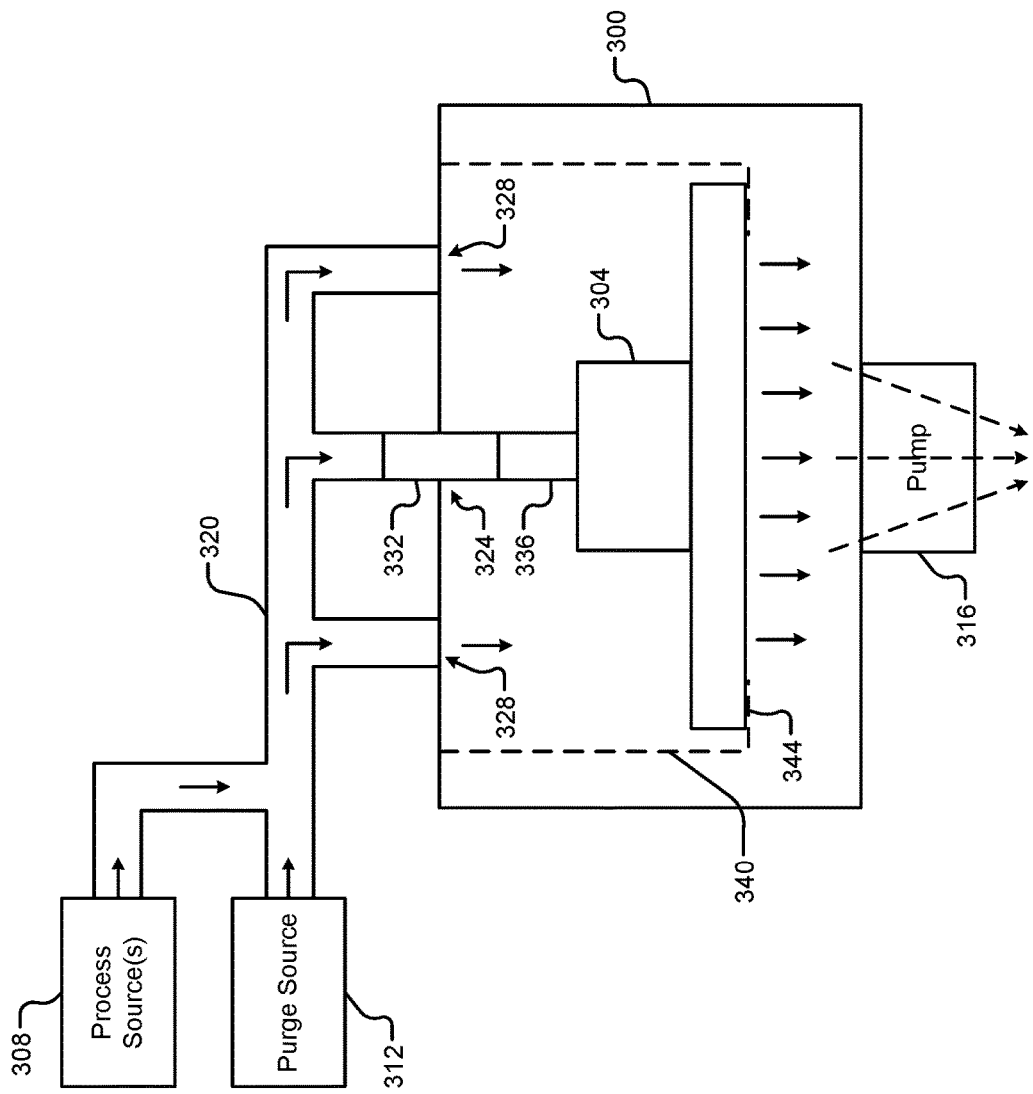

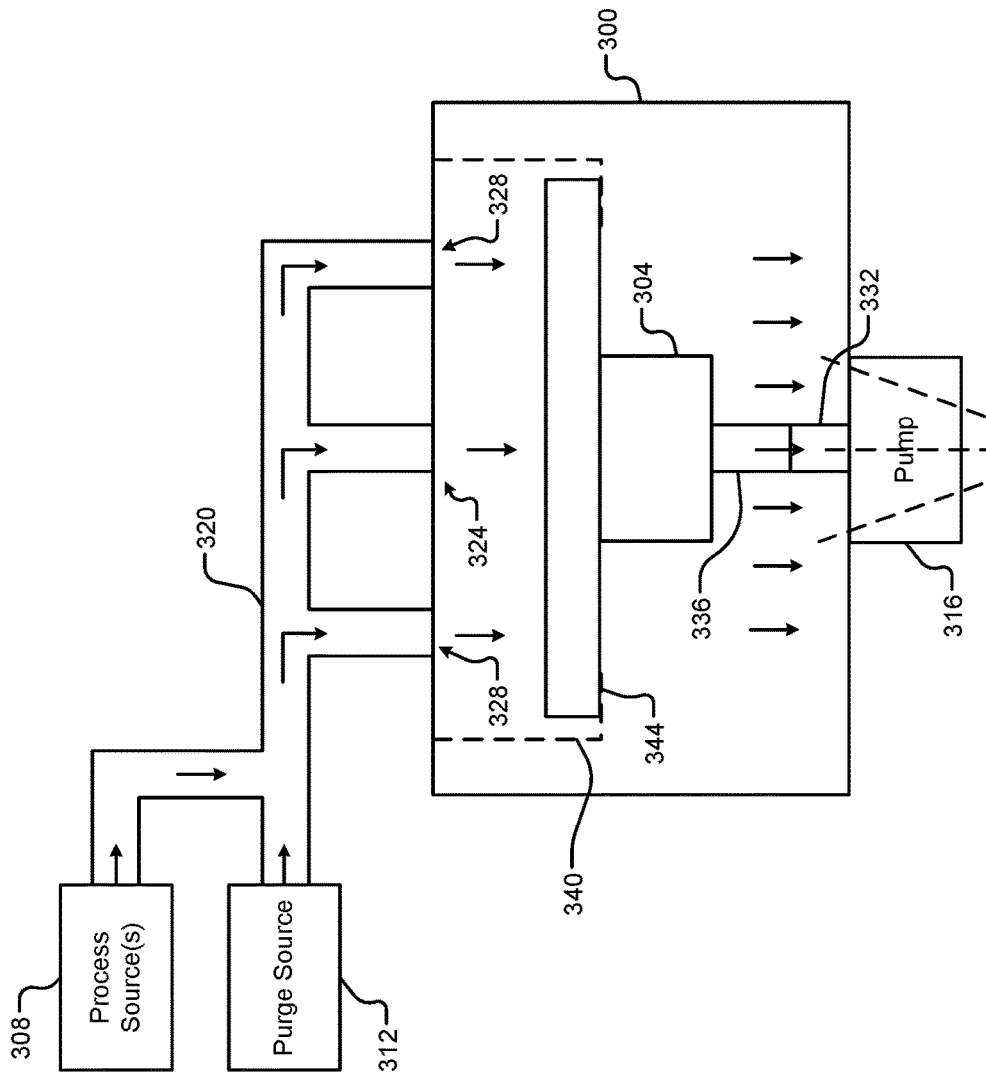

ULTRA-LOW DEFECT PART PROCESS

CROSS-REFERENCE TO RELATED APPLICATIONS

This application claims the benefit of U.S. Provisional Application No. 62/417,529, filed on Nov. 4, 2016 and U.S. Provisional Application No. 62/420,709, filed on Nov. 11, 2016. The entire disclosures of the applications referenced above are incorporated herein by reference.

FIELD

The present disclosure relates to fabrication of components of vacuum processing systems used for processing substrates, and to coating surfaces of a processing chamber using vacuum processing equipment, such as thermal processing equipment.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates such as semiconductor wafers. Example processes that may be performed on a substrate include, but are not limited to, chemical vapor deposition (CVD), atomic layer deposition (ALD), conductor etch, rapid thermal processing (RTP), ion implant, physical vapor deposition (PVD), and/or other etch, deposition, or cleaning processes. A substrate may be arranged on a substrate support, such as a pedestal, an electrostatic chuck (ESC), etc. in a processing chamber of the substrate processing system. During processing, gas mixtures including one or more precursors may be introduced into the processing chamber and plasma may be used to initiate chemical reactions.

The processing chamber includes various components including, but not limited to, the substrate support, a gas distribution device (e.g., a showerhead, which may also correspond to an upper electrode), a plasma confinement shroud, etc. The substrate support may include a ceramic layer arranged to support a wafer. For example, the wafer may be clamped to the ceramic layer during processing. The substrate support may include an edge ring arranged around an outer portion (e.g., outside of and/or adjacent to a perimeter) of the substrate support. The edge ring may be provided to confine plasma to a volume above the substrate, protect the substrate support from erosion caused by the plasma, etc. The plasma confinement shroud or other chamber process uniformity control structures may be arranged around each of the substrate support and the showerhead to further confine the plasma within the volume above the substrate.

SUMMARY

A method for removing and preventing defects on surfaces of a component of a substrate processing chamber includes loading the component into a vacuum chamber and, with the component loaded within the vacuum chamber, baking the component at a baking temperature during a first predetermined period to remove water and defects from the surfaces of the component, and purging the component within the vacuum chamber during at least one second predetermined period to remove the defects from the vacuum chamber. In other features, the method includes, prior to removing the component from the vacuum chamber and installing the component within the substrate processing chamber, optionally depositing a protective coating to the surfaces of the component.

In other features, the method includes, prior to removing the component from the vacuum chamber and installing the component within the substrate processing chamber, optionally depositing a protective coating to the surfaces of the component. The baking temperature is approximately 200° C. The component corresponds to a showerhead of the substrate processing chamber. The second predetermined period is subsequent to the first predetermined period. The first predetermined period and the second predetermined period overlap.

In other features, the purging is performed for two or more of the second predetermined periods. The two or more of the second predetermined periods are within the first predetermined period. The baking and purging are repeated two or more times prior to depositing the protective coating.

In other features, the protective coating is applied in a monolayer. The protective coating includes a hydrophobic material. The protective coating corresponds to a silane coating. The protective coating includes an organosilane. The protective coating includes hexamethyldisilazane (HMDS).

In other features, each of the baking, the purging, and depositing the protective coating is performed with a pressure within the vacuum chamber maintained at 1-760 Torr. The purging includes alternatingly providing purge gas to the vacuum chamber and pumping material from the vacuum chamber.

A method for vapor coating a component of a substrate processing chamber prior to opening the substrate processing chamber includes receiving an indication that the substrate processing chamber will be opened, in response to receiving the indication, providing vapor to the substrate processing chamber to apply a hydrophobic vapor coating to the component and to interior surfaces of the substrate processing chamber, and purging the substrate processing chamber. The method further includes selectively repeating providing the vapor and purging the substrate processing chamber.

In other features, providing the vapor is performed in a first period and purging the substrate processing chamber is performed in a second period, and the first period and the second period at least partially overlap. Purging the substrate processing chamber includes alternating between purging and not purging while providing the vapor. The vapor coating includes silane.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 3A and 3B are example vacuum chambers of a part processing system according to the principles of the present disclosure;

In the drawings, reference numbers may be reused to identify similar and/or identical elements.

DETAILED DESCRIPTION

Figure 1:
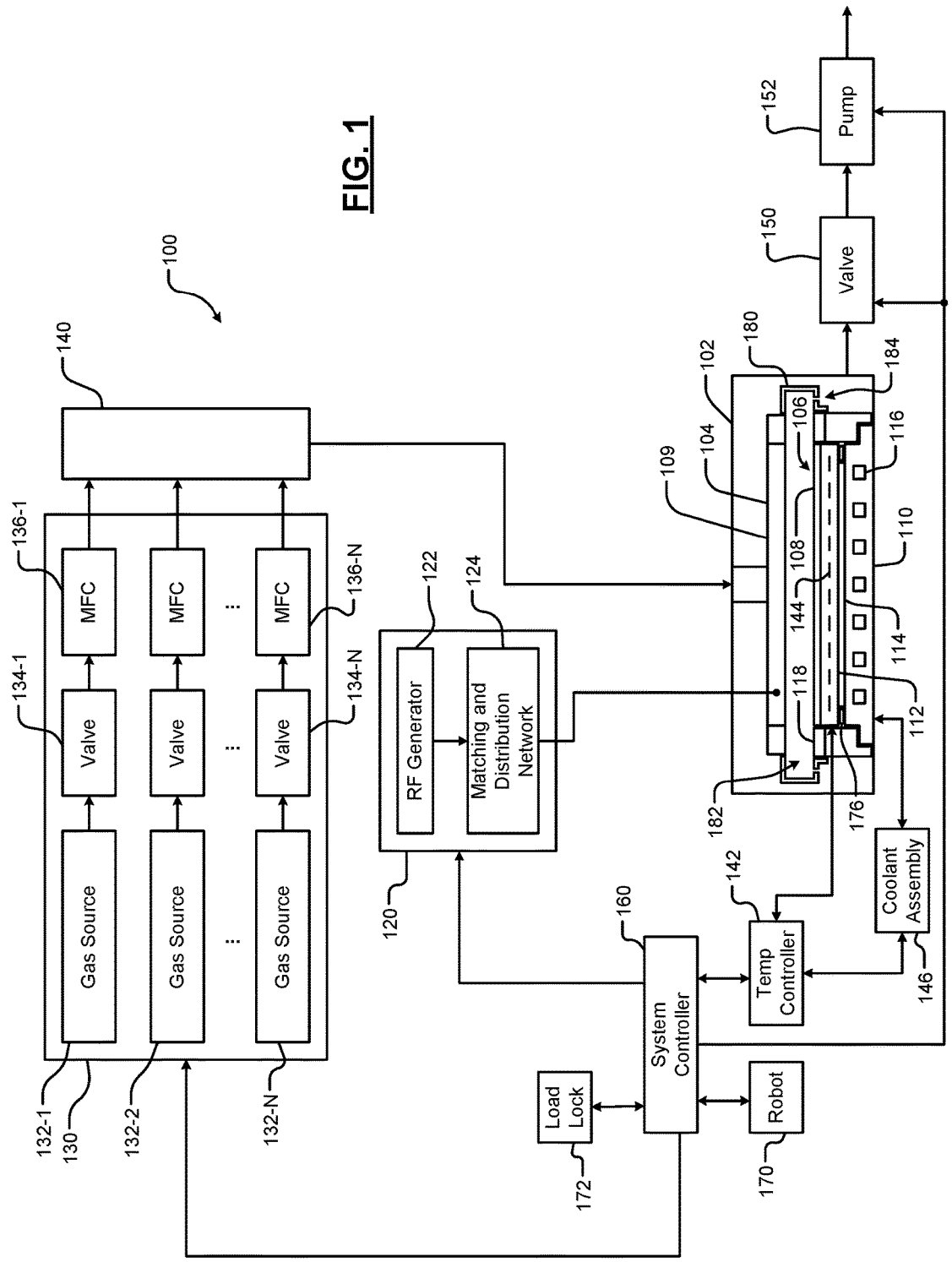
FIG. 1 is a functional block diagram of an example processing chamber according to the present disclosure.

Components arranged within a processing chamber of a substrate processing system include, but are not limited to, a gas distribution device (e.g., a showerhead), a plasma confinement shroud, and/or a substrate support including a baseplate, one or more edge rings, coupling rings, etc. These and other components are fabricated, using various fabrication processes, outside of the processing chamber. Components may also be removed from the processing chamber for repair, cleaning, resurfacing, replacement, etc. These and other components and interior surfaces of the processing chamber may be cleaned during periodic preventive maintenance. For example, the processing chamber may be opened to provide access for servicing and cleaning the components in situ and servicing and cleaning the interior surfaces (e.g., chamber walls) of the processing chamber.

Components within the processing chamber that may affect processing of a substrate may be referred to as critical chamber parts. Accordingly, defects (e.g., particles, nanometer-sized defects, metal contaminants, etc.) associated with the components introduced into the chamber may interfere with processing of the substrate. For example, defects may adhere to components that are fabricated, machined, cleaned, etc. outside of the processing chamber and may therefore be brought into the processing chamber with the components. In particular, defects may adhere to the components due to water remaining on surfaces of the components subsequent to fabrication or cleaning processes (e.g., water remaining after a wet cleaning step, and/or water that is reabsorbed onto and/or otherwise attached to the surfaces after wet cleaning and baking steps). The components may then shed the defects at startup and during processing (e.g., etch, deposition, etc.), degrading startup performance and processing results.

In other examples, opening the processing chamber exposes the components and the interior surfaces of the processing chamber to ambient air, which may include moisture. Accordingly, a coating (e.g., a monolayer) of water may be deposited on the components and/or the interior surfaces of the processing chamber. Subsequent to cleaning, the processing chamber may be pumped down to remove the water and other residual contaminants/defects from the processing chamber. However, prior to removal, the water present within the chamber functions as a solvent and may extract material (e.g., as ions) from various surfaces within the processing chamber. Example materials extracted into the water may include, but are not limited to, zinc, iron, aluminum, chromium, bismuth, and copper.

Subsequent to removal/evaporation of the water from within the processing chamber, the material extracted by the water may remain within the processing chamber as metal contaminant defects. The processing chamber (i.e., surfaces of components and the interior surfaces of the processing chamber) may then shed the defects at startup and during processing (e.g., etch, deposition, etc.), degrading startup performance and processing results.

Systems and methods according to the principles of the present disclosure reduce the amount of defects that attach to the surface of processing chamber components during and subsequent to machining, wet cleaning, and/or other fabrication steps. In example implementations, defects and metal contaminants may be removed from the components by cycle purging using a combination of vacuum pumping, gas purge, and elevated temperatures. Dehydration of part surfaces may aid in defect and metal contamination reduction. Optionally, a protective coating (e.g., a monolayer coating) may be applied to the surfaces to protect the part from additional water absorption.

In other examples, systems and methods according to the principles of the present disclosure reduce the amount of defects that attach to the surface of processing chamber surfaces and components during and subsequent to in situ servicing and cleaning (e.g., wet cleaning). For example, prior to opening the processing chamber for cleaning and/or other preventive maintenance, a protective coating (e.g., a monolayer coating) is applied to interior surfaces of the processing chamber to prevent water absorption. For example, the coating comprises a hydrophobic material. A similar coating may be applied to surfaces of components within the processing chamber. In some examples, components being installed during servicing may be pre-coated (e.g., vacuum baked to remove water and then coated with a hydrophobic coating prior to installation within the processing chamber).

Example coatings include, but are not limited to, silane coatings, such as an organosilane, hydrophobic coating (e.g., Bis(trimethylsilyl)amine, or hexamethyldisilazane (HMDS)). Other example coatings include, but are not limited to, alkylsilanes (e.g., n-octadecyltrichlorosilane, isobutyltrimethoxysilane, etc.), fluroalkylsilanes (e.g., (tridecafluoro-1, 1, 2, 2-tetrahydrooctyl) trichlorosilane, (3, 3, 3-trifluropropyl) trichlorosilane, (heptadecafluoro-1, 1, 2, 2-tetrahydrodecyl) trichlorosilane, etc.), and silicones (e.g., (25-35% methylhydrosiloxane)—dimethylsiloxane copolymer, trimethylsiloxane, trimethylsiloxane terminated, hydride terminated polydimethylsiloxane, polydimethylsiloxane, trimethylsiloxy terminated, diacetoxymethyl terminated polydimethylsiloxane, etc.). In one example, the components are baked in a vacuum chamber to remove surface water and defects, and the coating is applied in the same chamber. Accordingly, the coating prevents absorption of water from the atmosphere onto the surfaces of the components after removal from the vacuum chamber and prior to being arranged within the process chamber, during and subsequent to cleaning, etc. In some examples, only hydrophobic materials may be used for cleaning. In this manner, defects introduced into the process chamber by components are minimized, and pumping of the process chamber to remove water and other materials is reduced. As used herein, the protective coating may be referred to as a coating, layer, and/or film.

Referring now to FIG. 1, an example substrate processing system 100 is shown. For example only, the substrate processing system 100 may be used for performing etching using RF plasma and/or other suitable substrate processing. The substrate processing system 100 includes a processing chamber 102 that encloses other components of the substrate processing system 100 and contains the RF plasma. The substrate processing chamber 102 includes an upper electrode 104 and a substrate support 106, such as an electrostatic chuck (ESC). During operation, a substrate 108 is arranged on the substrate support 106. While a specific substrate processing system 100 and chamber 102 are shown as an example, the principles of the present disclosure may be applied to other types of substrate processing systems and chambers, such as a substrate processing system that generates plasma in-situ, that implements remote plasma generation and delivery (e.g., using a plasma tube, a microwave tube), etc.

For example only, the upper electrode 104 may include a gas distribution device such as a showerhead 109 that introduces and distributes process gases. The showerhead 109 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which process gas or purge gas flows. Alternately, the upper electrode 104 may include a conducting plate and the process gases may be introduced in another manner.

The substrate support 106 includes a conductive baseplate 110 that acts as a lower electrode. The baseplate 110 supports a ceramic layer 112. In some examples, the ceramic layer 112 may comprise a heating layer, such as a ceramic multi-zone heating plate. A thermal resistance layer 114 (e.g., a bond layer) may be arranged between the ceramic layer 112 and the baseplate 110. The baseplate 110 may include one or more coolant channels 116 for flowing coolant through the baseplate 110. The substrate support 106 may include an edge ring 118 arranged to surround an outer perimeter of the substrate 108.

An RF generating system 120 generates and outputs an RF voltage to one of the upper electrode 104 and the lower electrode (e.g., the baseplate 110 of the substrate support 106). The other one of the upper electrode 104 and the baseplate 110 may be DC grounded, AC grounded or floating. For example only, the RF generating system 120 may include an RF voltage generator 122 that generates the RF voltage that is fed by a matching and distribution network 124 to the upper electrode 104 or the baseplate 110. In other examples, the plasma may be generated inductively or remotely. Although, as shown for example purposes, the RF generating system 120 corresponds to a capacitively coupled plasma (CCP) system, the principles of the present disclosure may also be implemented in other suitable systems, such as, for example only transformer coupled plasma (TCP) systems, CCP cathode systems, remote microwave plasma generation and delivery systems, etc.

A gas delivery system 130 includes one or more gas sources 132-1, 132-2, . . . , and 132-N (collectively gas sources 132), where N is an integer greater than zero. The gas sources supply one or more precursors and mixtures thereof. The gas sources may also supply purge gas. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

A temperature controller 142 may be connected to a plurality of heating elements, such as thermal control elements (TCEs) 144 arranged in the ceramic layer 112. For example, the heating elements 144 may include, but are not limited to, macro heating elements corresponding to respective zones in a multi-zone heating plate and/or an array of micro heating elements disposed across multiple zones of a multi-zone heating plate. The temperature controller 142 may be used to control the plurality of heating elements 144 to control a temperature of the substrate support 106 and the substrate 108. Each of the heating elements 144 according to the principles of the present disclosure includes a first material having a positive TCR and a second material having a negative TCR as described below in more detail.

The temperature controller 142 may communicate with a coolant assembly 146 to control coolant flow through the channels 116. For example, the coolant assembly 146 may include a coolant pump and reservoir. The temperature controller 142 operates the coolant assembly 146 to selectively flow the coolant through the channels 116 to cool the substrate support 106.

A valve 150 and pump 152 may be used to evacuate reactants from the processing chamber 102. A system controller 160 may be used to control components of the substrate processing system 100. A robot 170 may be used to deliver substrates onto, and remove substrates from, the substrate support 106. For example, the robot 170 may transfer substrates between the substrate support 106 and a load lock 172. Although shown as separate controllers, the temperature controller 142 may be implemented within the system controller 160. In some examples, a protective seal 176 may be provided around a perimeter of the bond layer 114 between the ceramic layer 112 and the baseplate 110.

In some examples, the processing chamber 102 may include a plasma confinement shroud 180, such as a C-shroud. The C-shroud 180 is arranged around the upper electrode 104 and the substrate support 106 to confine plasma within a plasma region 182. In some examples, the C-shroud 180 comprises a semiconductor material, such as silicon carbide (SiC). The C-shroud 180 may include one or more slots 184 arranged to allow gases to flow out of the plasma region 182 to be vented from the plasma chamber 102 via the valve 150 and the pump 152.

Various components of the processing chamber 102 may be processed using an ultra-low defect part process according to the principles of the present disclosure. For example, components processed as described herein may include, but are not limited to, the upper electrode 104, the showerhead 109, the edge ring 118, the plasma confinement shroud 180, any components including silicon, aluminum, and/or quartz, and/or any other components of the processing chamber 102. For example only, the ultra-low defect part process is described below with respect to the processing of a showerhead. In some examples, a protective, hydrophobic coating may be applied to interior surfaces (and, in some examples, various components) of the processing chamber 102 using a vapor coating process.

Figure 2:
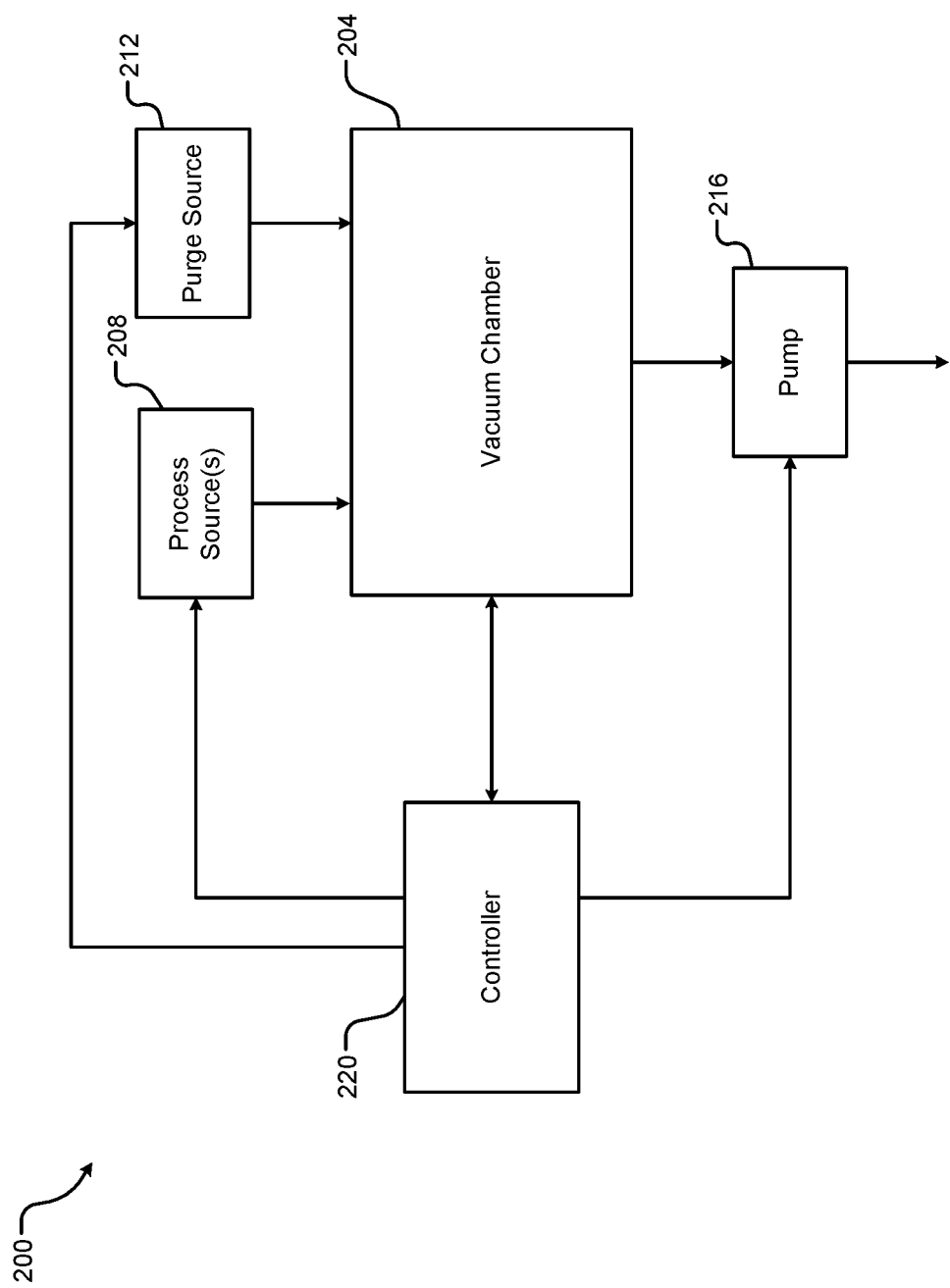
FIG. 2 is a functional block diagram of an example part processing system according to the present disclosure.

Referring now to FIG. 2, an example part processing system 200 includes a vacuum chamber 204 configured to receive and support a component for various processing steps subsequent to wet cleaning and prior to installation within a substrate processing chamber. For example, the vacuum chamber 204 may correspond to a vacuum oven modified to interface with one or more process sources 208, a purge source 212, and a pump 216. In some examples, a controller 220 communicates with the vacuum chamber 204, the process source 208, the purge source 212, and/or the pump 216.

In one example, a component (e.g., a showerhead) is loaded into the vacuum chamber 204. The component may include residual water and associated defects remaining after fabrication and/or wet cleaning and/or production use in a vacuum processing system and/or subsequent exposure to atmosphere. The system 200 performs a vacuum bake step (i.e., a dehydration step) with the component loaded within for a first predetermined period. For example, the vacuum chamber 204 may be maintained at a baking temperature of approximately 200° C. (e.g., between 190 and 210° C.) and between 1 and 760 Torr during the vacuum bake step. In other examples, the baking temperature may be maintained within a range of 180-270° C. or 150-300° C. Accordingly, the vacuum bake step evaporates, and therefore removes, residual water/moisture from the surface of the component. Removing water from the surface of the component inhibits defects from adhering to the component.

The system 200 performs a purge step for a second predetermined period to remove the evaporated water and the defects from the vacuum chamber 204. For example, during purging, the pump 216 is operated to purge the defects from the vacuum chamber 204. A purge gas, such as nitrogen ($N_2$) and/or oxygen ($O_2$), may be provided to the vacuum chamber 204 from the purge source 212 during the purge step. Accordingly, the purge gas is purged from the vacuum chamber 204 along with the defects removed from the surface of the component. In one example, the purge gas may be heated prior to entering the vacuum chamber 204 to maintain the vacuum chamber 204 at the desired temperature. The purge step and the vacuum bake step may be performed simultaneously (i.e., purging is performed continuously during vacuum baking), and/or may at least partially overlap. In another example, the purge step is performed subsequent to the vacuum bake step. In another example, the system 200 cycles alternating purge and vacuum bake steps (e.g., for 2 hours), and/or pulses a plurality of purge steps during an extended vacuum bake step. In this manner, the system 200 generates turbulent flow within the vacuum chamber 204 to facilitate removal of the defects. In other words, the first predetermined period and the second predetermined period may correspond to concurrent periods, overlapping periods, sequential, non-overlapping periods, a plurality of alternating periods, etc.

Subsequent to completion of the vacuum bake step and the purge step, the system 200 may perform a vacuum coating step (i.e., a coating step while the chamber 204 is under vacuum) to apply a coating to the surfaces of the component. In other words, subsequent to vacuum baking the component and purging defects from the component, and with the component still loaded within the vacuum chamber 204, a coating may be applied to the surfaces of the component. For example, various process gases may be provided from the process source(s) 208 to the chamber 204 to apply the coating. With the chamber 204 under vacuum, the provided source fluid or gas vaporizes and fills the chamber 204 to coat all exposed surfaces of the component. In some example, another purge step may be performed subsequent to the vacuum coating step to remove any residual materials from the chamber 204.

The coating comprises a hydrophobic material (e.g., film) that prevents water and associated defects from reabsorbing/reattaching to the surfaces of the component. Accordingly, when the component is removed from the chamber 204 for transfer to a substrate processing chamber, water and associated defects and metal contaminants attaching to the surfaces of the component are minimized. Example coatings include, but are not limited to, silane coatings, such as an organosilane, hydrophobic coating (e.g., Bis(trimethylsilyl) amine, or hexamethyldisilazane (HMDS)).

In some examples, the coating is applied as a monolayer (e.g., a layer having a thickness of 1 atom or 1 molecule of the corresponding material). The coating may be configured to be removed within the substrate processing chamber prior to any processing of a substrate. In other words, the coating may correspond to a sacrificial layer. For example, substrate processing systems may perform a "seasoning" step, prior to processing substrates, when new components are installed. The seasoning step may remove any remaining contaminants and/or defects within the processing chamber subsequent to installation of new components, repairs, etc. In some examples, seasoning includes generating plasma and/or performing other chemical processes to clean, condition, and/or otherwise prepare the processing chamber 204. Accordingly, the seasoning step removes the coating applied by the part processing system 200.

In one example, the chamber 204 may be configured to process a specific component of a substrate processing chamber (e.g., a showerhead). Accordingly, an interior of the chamber 204 may be configured to accommodate that specific component. For example, the interior of the chamber 204 may be sized according to the corresponding component, or may include additional structure configured to support, hang, etc. the component. In other examples, the chamber 204 may be configured to process any of the components of a substrate processing chamber. In some examples, the chamber 204 may be configured to accommodate and process two or more components simultaneously.

The controller 220 may be configured to control the part processing system 200 according to predetermined settings for respective components. For example, the controller 220 may store one or more sets of predetermined settings associated with controlling the part processing system 200, including, but not limited to, control parameters associated with the pump 216 (e.g., on and off periods), the process source 208 (e.g. on and off periods, flow rates, etc.), the purge source 212 (e.g. on and off periods, flow rates, etc.), and heating elements for temperature control. Any control parameters may also be manually input by a user. In examples where the chamber 204 is configured to process two or more types of components of a substrate processing system, the controller 220 may store a different set of predetermined settings for each component. For example, a showerhead may have a first associated set of settings, while an edge ring may have a second associated set of settings. The controller 220 may be configured to automatically select the appropriate set of predetermined settings based on receiving (e.g., from a user) an indication of which component is loaded within the chamber 204 for processing.

Referring now to FIGS. 3A and 3B, an example vacuum chamber 300 configured for processing a showerhead 304 is shown. In FIG. 3A, the showerhead 304 is shown arranged in the vacuum chamber 300 in a first configuration (e.g., an upright configuration). Conversely, in FIG. 3B, the showerhead 304 is shown arranged in the vacuum chamber 300 in a second configuration (e.g., an upside down configuration). The chamber 300 interfaces with a process source(s) 308, a purge source 312, and a pump 316 as described above with respect to FIG. 2. For example, the process source 308 and the purge source 312 are in fluid communication with an interior of the chamber 300 via a manifold 320 and various inlets 324 and 328 arranged in an upper surface of the chamber 300. Although, as shown, the process source 308 and the purge source 312 share the same manifold 320 and inlets 324 and 328, the process source 308 and the purge source 312 may each use respective, independent manifolds and inlets in other examples.

The inlets 328 may include one or more inlets 328 arranged above and around a perimeter of the showerhead 304. Although shown arranged in the upper surface of the chamber 300, in other examples the inlets 328 may be arranged in sidewalls of the chamber 300, in a bottom surface of the chamber 300, etc. depending on a size, shape, configuration, etc. of the showerhead or other component being processed within the chamber 300. Conversely, the inlet 324 is arranged to be in fluid communication with an interior of the showerhead 304. For example, in the configuration shown in FIG. 3A, the inlet 324 may include a connector 332 extending through the upper surface of the chamber 300 and connecting to each of the manifold 320 and an inlet 336 of the showerhead 304. Conversely, in the configuration shown in FIG. 3B, the connecter 332 may be arranged to connect the inlet 336 of the showerhead 304 to an inlet of the pump 316. For example only, the connector 332 may correspond to an ultra-Torr fitting.

The chamber 300 may include a support structure, such as a hanger or shelf 340, arranged to support the showerhead 304 during processing. For example, the shelf 340 may be connected to the upper surface of the chamber 300 and extend downward into the interior of the chamber 300 to provide a surface 344 positioned to support the showerhead 304. Chambers configured for processing other types of components may include suitable respective support structures. In some examples, the chamber 300 may also be configured to perform a wet cleaning step prior to the part processing steps according to the principles of the present disclosure.

Figure 4:
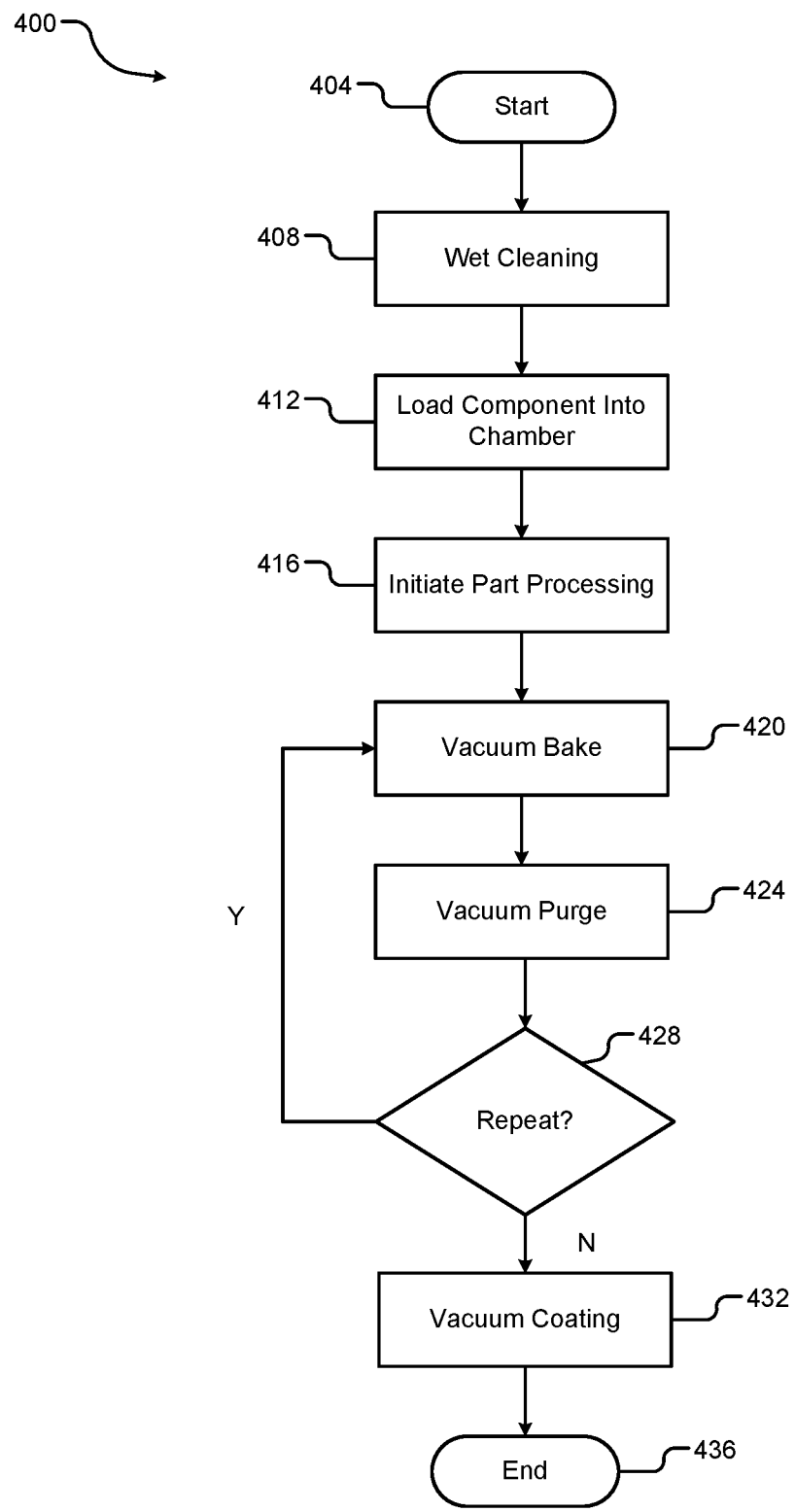
FIG. 4 illustrates steps of an example part processing method according to the principles of the present disclosure.

Referring now to FIG. 4, an example part processing method 400 begins at 404. At 408, the method 400 performs a wet cleaning (or another post-fabrication step, pre on a component (e.g., a showerhead) of a substrate processing chamber. At 412, the showerhead is loaded into a vacuum chamber according to the principles of the present disclosure. For example, the showerhead may be loading into a vacuum chamber configured specifically for processing showerheads, such as the vacuum chamber 300 described in FIGS. 3A and 3B.

At 416, a user initiates part processing. In some examples, the user may simply provide an input to initiate the part processing (e.g., via an interface of the controller 220). In other examples, the user may be required to input control parameters, information about the component being processed, etc. The user may be prompted to provide the inputs, and/or may manually input control parameters prior to or subsequent to each step of the method 400 (e.g., to initiate and terminate each step).

At 420, the method 400 performs a vacuum bake step. At 424, the method 400 performs a vacuum purge step. At 428, the method 400 determines whether to repeat vacuum baking and purging. For example, repeating the vacuum baking and purging may correspond to cycling alternating pulses of baking and purging as described above with respect to FIG. 2. Further, although illustrated as separate steps, the vacuum baking and purging shown at 420 and 424 may at least partially overlap such that purging is performed during at least a portion of the vacuum baking. For example, the purging may by pulsed (i.e., cycled between purging and not purging) during a continuous vacuum baking step (i.e., without vacuum baking being interrupted or paused).

If the result of 428 is true, the method 400 continues to 420. If false, the method 400 continues to 432. At 436, the method 400 may apply a vacuum coating to the showerhead. The method 400 ends at 436.

Figure 5:
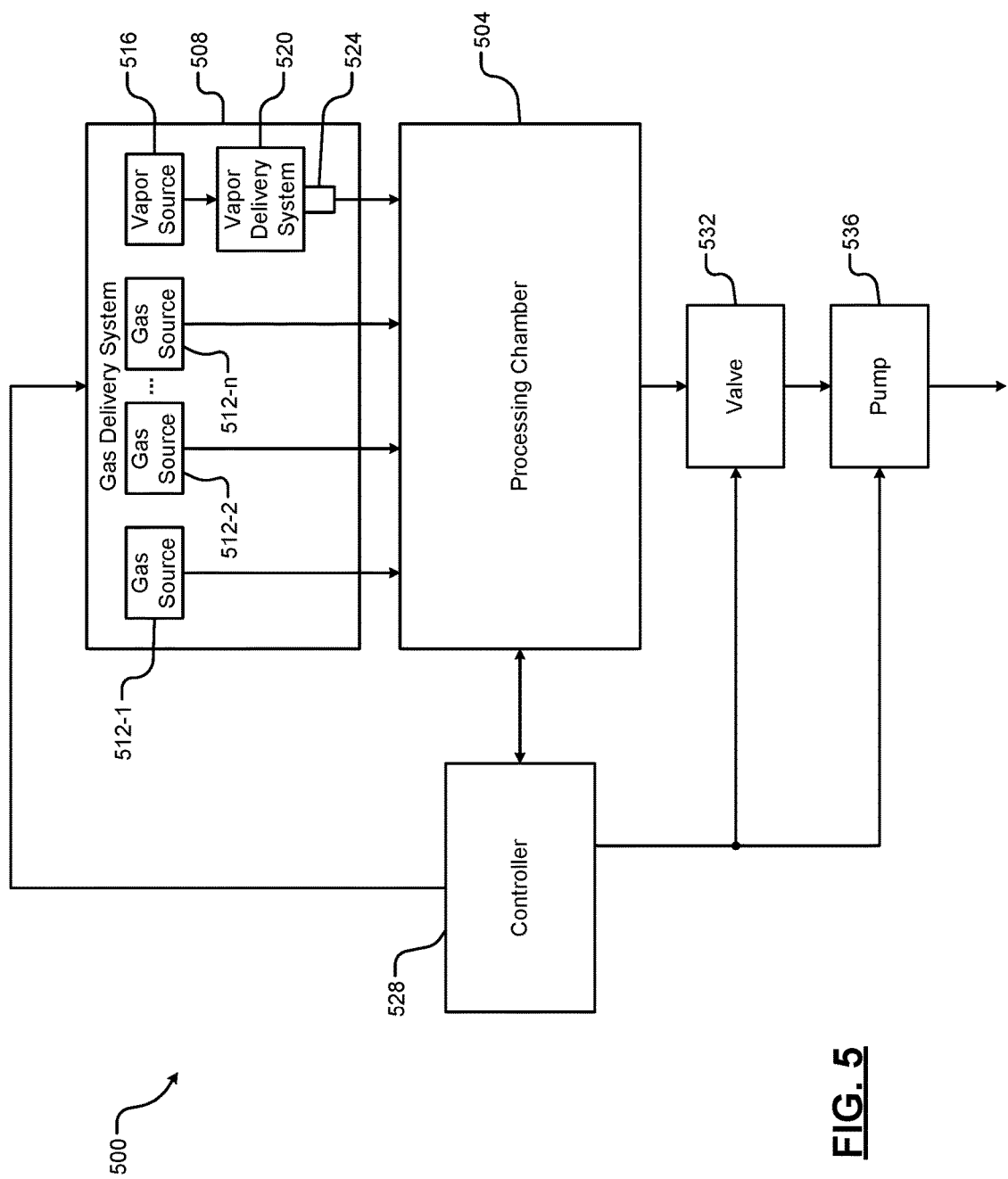
FIG. 5 is a functional block diagram of an example vapor coating system for a processing chamber according to the present disclosure.

Referring now to FIG. 5, an example vapor coating system 500 includes a processing chamber 504, which may correspond to the processing chamber 102 as described above in FIG. 2. The system 500 includes a gas delivery system 508 modified according to the principles of the present disclosure. For example, the gas delivery system 508 may include a plurality of gas sources 512-1, 512-2, . . . , and 512-n, referred to collectively as gas sources 512. The gas sources 512 may correspond to various process and purge gas sources. The gas delivery system 508 further includes a vapor source 516 configured to provide coating material to the processing chamber 504. In some examples, the vapor source 516 stores the coating material as a vapor and provides the vapor to the processing chamber 504. In other examples, the vapor source 516 stores the coating material as a liquid and provides the liquid to a vapor delivery system 520 configured to vaporize the liquid and provide the coating material as a vapor to the processing chamber 504. For example, the vapor delivery system 520 may include a nozzle 524 configured to vaporize liquid.

The system 500 further includes a controller 528 (e.g., corresponding to the system controller 160), a valve 532 (e.g., corresponding to the valve 150), and a pump 536 (e.g., corresponding to the pump 152). The system 500 may include other components analogous to components of the system 100. However, these other components are omitted for simplicity. For example, the gas delivery system 508 may further include a plurality of valves, mass flow controllers, a manifold, etc. analogous to the components of the gas delivery system 130 of FIG. 1.

The vapor source 516 provides the coating material (e.g., as a vapor, or, in some examples, as a liquid to be vaporized by vapor delivery system 520) to the processing chamber 504 to coat interior surfaces (e.g., surfaces of chamber walls) of the processing chamber 504 and of components (e.g., a showerhead, a substrate support, etc.) arranged therein. The coating material forms a hydrophobic film (e.g., a monolayer having a thickness of 1 atom or 1 molecule of the corresponding material) on the surfaces within the processing chamber 504. For example only, the coating material is comprised of a hydrophobic material including, but not limited to, a silane coating, such as an organosilane, alkylsilane, fluroalkylsilane, silicone, etc. The coating adheres to the surfaces within the processing chamber 504 and prevents absorption of water from the atmosphere onto the surfaces of the processing chamber 504 and components when the processing chamber 504 is opened for preventive maintenance. In other examples, the coating may not be hydrophobic and instead simply functions as a vapor barrier to prevent contact between water/vapor and surfaces within the processing chamber 504.

In one example, the system 500 is configured to perform a vapor coating step to apply the coating prior to any opening of the processing chamber 504. For example, the controller 528 may be configured to automatically initiate the vapor coating step in response to any indication that a user intends to open the processing chamber 504. In some examples, the controller 528 may initiate a visual or audio indicator to alert and prompt a user to initiate the vapor coating step prior to opening the processing chamber 504, and/or may prevent the processing chamber 504 from being opened by the user prior to the vapor coating step being performed. In this manner, the system 500 may ensure that the vapor coating step is performed prior to any opening of the processing chamber 504.

In one example, the vapor coating step includes providing the coating material as a vapor to the processing chamber 504 during a first predetermined period followed by purging the processing chamber (e.g., via the valve 532 and the pump 536) during a second predetermined period. A purge gas, such as nitrogen ($N_2$) and/or oxygen ($O_2$), may be provided to the processing chamber 504 using the gas delivery system 508 during purging. The second predetermined period may begin subsequent to completion of the first predetermined period and/or the first predetermined period and the second predetermined period may overlap. In other examples, the system 500 may alternate providing the vapor and purging the processing chamber 504 for a plurality of cycles. In other words, the first predetermined period and the second predetermined period may correspond to concurrent periods, overlapping periods, sequential, non-overlapping periods, a plurality of alternating periods, etc.

In examples where the processing chamber 504 is opened subsequent to the vapor coating step to replace and/or install components (e.g., to remove and replace the showerhead), the components to be installed may be coated with a similar hydrophobic coating prior to installation within the processing chamber 504. Accordingly, water and associated defects on the newly-installed components may be minimized.

The coating on the surfaces of the processing chamber 504 and the components may be configured to be removed subsequent to the vapor coating step, completion of maintenance, and closing of the processing chamber 504 and prior to any processing of a substrate. For example, the coating may correspond to a sacrificial layer. For example, substrate processing systems may perform a "seasoning" step, including pumping down the processing chamber 504 to remove residual moisture and defects from the processing chamber 504, prior to processing substrates. The seasoning step may remove any remaining contaminants and/or defects within the processing chamber subsequent to installation of new components, cleaning, repairs, etc. In some examples, seasoning includes generating plasma and/or performing other chemical processes to clean, condition, and/or otherwise prepare the processing chamber 504. Accordingly, the seasoning step removes the coating applied during vapor coating step. In other words, the coating may only persist from application of the coating during the vapor coating step, during maintenance while the processing chamber 504 is opened, and until removal prior to substrate processing.

In other examples, the coating is comprised of material that is neutral to substrate processing performed within the processing chamber 504. In other words, if the coating is not configured to be completely removed prior to substrate processing, the coating may comprise materials that do not adversely affect substrate processing steps.

In examples where interior surfaces of the processing chamber 504 are manually cleaned subsequent to application of the coating, cleaning may be performed only with hydrophobic liquids and/or materials that will not remove the coating from the surfaces of the processing chamber 504. Accordingly, inadvertent removal of the coating prior to closing the processing chamber 504 may be minimized. In some examples the controller 528 may be configured to alert a user (e.g., via a display) that only hydrophobic liquids should be used to clean surfaces within the processing chamber 504.

Figure 6:
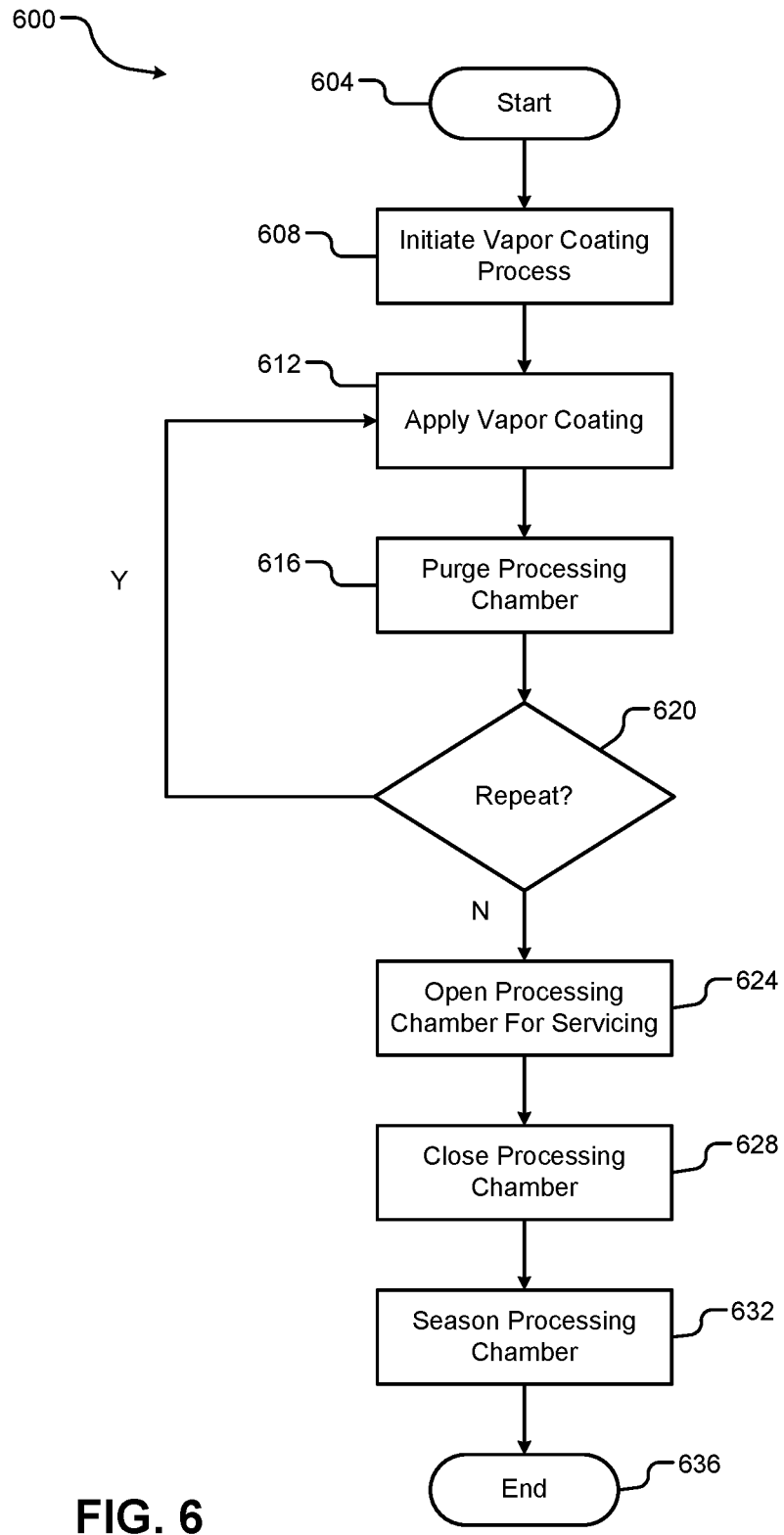
FIG. 6 illustrates steps of an example vapor coating method according to the principles of the present disclosure.

Referring now to FIG. 6, an example vapor coating method 600 begins at 604. At 608, the method 600 initiates a vapor coating process. For example, the method 600 may receive an indication that the processing chamber will be opened and automatically initiate the vapor coating process (e.g., using the controller 528), and/or a user may initiate the vapor coating process. At 612, the method 600 provides vapor to the processing chamber to apply a hydrophobic vapor coating (i.e., film) to interior surfaces of the processing chamber. At 616, the method 600 purges the processing chamber.

At 620, the method 600 determines whether to repeat the vapor coating and purging steps. For example, repeating the vapor coating and purging steps may correspond to cycling alternating pulses of vapor coating and purging as described above with respect to FIG. 5. Further, although illustrated as separate steps, the vapor coating and purging shown at 612 and 616 may at least partially overlap such that purging is performed during at least a portion of the vapor coating. For example, the purging may by pulsed (i.e., cycled between purging and not purging) during a continuous vacuum coating step (i.e., without vacuum coating being interrupted or paused).

If the result of 620 is true, the method 600 continues to 612. If false, the method 600 continues to 624. At 624, the processing chamber is opened for maintenance, cleaning, etc. At 628, the processing chamber is closed subsequent to completion of maintenance and/or cleaning. At 632, the processing chamber may be prepared for performing substrate processing. For example, the processing chamber may be seasoned. The method 600 ends at 636.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for removing and preventing defects on surfaces of a component of a substrate processing chamber, the method comprising:
    loading the component into a vacuum chamber; and
    with the component loaded within the vacuum chamber,
    (i) baking the component at a baking temperature during a first predetermined period to remove water and defects from the surfaces of the component,
    (ii) purging the component within the vacuum chamber during at least one second predetermined period to remove the defects from the vacuum chamber, and
    (iii) subsequent to (ii) and prior to removing the component from the vacuum chamber and installing the component within the substrate processing chamber, depositing a protective coating to the surfaces of the component.

2. The method of claim 1, wherein the baking temperature is approximately 200° C.

3. The method of claim 1, wherein the component corresponds to a showerhead of the substrate processing chamber.

4. The method of claim 1, wherein the second predetermined period is subsequent to the first predetermined period.

5. The method of claim 1, wherein the first predetermined period and the second predetermined period overlap.

6. The method of claim 1, wherein the purging is performed for two or more of the second predetermined periods.

7. The method of claim 6, wherein the two or more of the second predetermined periods are within the first predetermined period.

8. The method of claim 1, wherein (i) and (ii) are repeated two or more times prior to (iii).

9. The method of claim 1, wherein the protective coating is applied in a monolayer.

10. The method of claim 1, wherein the protective coating includes a hydrophobic material.

11. The method of claim 1, wherein the protective coating corresponds to a silane coating.

12. The method of claim 1, wherein the protective coating includes an organosilane.

13. The method of claim 1, wherein the protective coating includes hexamethyldisilazane (HMDS).

14. The method of claim 1, wherein each of (i), (ii), and (iii) is performed with a pressure within the vacuum chamber maintained at 1-760 Torr.

15. The method of claim 1, wherein the purging includes alternatingly providing purge gas to the vacuum chamber and pumping material from the vacuum chamber.

* * * * *